United States Patent
Kusai

(10) Patent No.: US 7,427,822 B2
(45) Date of Patent: Sep. 23, 2008

(54) PIEZOELECTRIC RESONATOR ELEMENT PACKAGE, AND PIEZOELECTRIC RESONATOR

(75) Inventor: Tsuyoshi Kusai, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 124 days.

(21) Appl. No.: 10/579,627

(22) PCT Filed: Mar. 11, 2005

(86) PCT No.: PCT/JP2005/004315

§ 371 (c)(1),
(2), (4) Date: May 17, 2006

(87) PCT Pub. No.: WO2005/109638

PCT Pub. Date: Nov. 17, 2005

(65) Prior Publication Data

US 2007/0145863 A1    Jun. 28, 2007

(30) Foreign Application Priority Data

May 12, 2004  (JP)  ............................. 2004-142082

(51) Int. Cl.
*H01L 41/08* (2006.01)
(52) U.S. Cl. ...................................... 310/344; 310/366
(58) Field of Classification Search ................. 310/344, 310/348
See application file for complete search history.

(56) References Cited

U.S. PATENT DOCUMENTS

| | | | | |
|---|---|---|---|---|
| 5,585,687 A | * | 12/1996 | Wakabayashi et al. | 310/366 |
| 5,699,027 A | * | 12/1997 | Tsuji et al. | 333/193 |
| 5,982,077 A | * | 11/1999 | Ide et al. | 310/366 |

FOREIGN PATENT DOCUMENTS

| | | |
|---|---|---|
| JP | 2000-269768 | 9/2000 |
| JP | 2001-345664 | 12/2001 |
| JP | 2002-158558 | 5/2002 |

* cited by examiner

*Primary Examiner*—Mark Budd
(74) *Attorney, Agent, or Firm*—Wenderoth, Lind & Ponack, L.L.P.

(57) ABSTRACT

A piezoelectric resonator element package has a base that holds a piezoelectric resonator element on which drive electrodes are formed, and a cap. Four electrode pads are formed in corners of an internal bottom surface of the base. Of the four electrode pads, the first electrode pad and second electrode pad have the different potential. The first electrode pad and third electrode pad have the same potential because of a first connecting electrode. The second electrode pad and fourth electrode pad have the same potential because of a second connecting electrode. An avoidance means is provided for avoiding electrical connection between electrode pads that have the different potential (the first electrode pad and second electrode pad) and the other electrode pads that have the same potential (the first electrode pad and third electrode pad, and the second electrode pad and fourth electrode pad).

18 Claims, 7 Drawing Sheets

PIEZOELECTRIC RESONATOR ELEMENT PACKAGE, AND PIEZOELECTRIC RESONATOR

TECHNICAL FIELD

This invention relates to a package for a piezoelectric resonator element such as a crystal resonator, crystal filter, crystal oscillator, or the like, and to a piezoelectric resonator, and more particularly relates to an improvement to the package electrode pads where a piezoelectric resonator element is mounted in a surface mount package composed of a ceramic material or the like.

BACKGROUND ART

Examples of electronic components that require an airtight seal include crystal resonators, crystal filters, crystal oscillators, and other such piezoelectric resonator devices. With all of these products, a metal thin-film electrode is formed on the surface of a crystal plate (piezoelectric resonator element), and an airtight seal is provided to protect this metal thin-film electrode from the outside atmosphere.

Because of the need for the surface mounting of components, these piezoelectric resonator devices are increasingly being housed hermetically inside a package composed of a ceramic material. For instance, Patent Document 1 discloses a package comprising a base (substrate) wit a concave cross section having four electrode pads (connecting electrodes) for the mounting of a crystal plate on the front and back faces on which are formed drive electrodes, and a cap (lid) with an inverted concave cross section, wherein this package is composed of a ceramic material and these components are hermetically sealed. Here, of the four electrode pads, two electrode pads that are opposite to each other in the long-side direction are connected to each other and given the same potential by connecting electrodes (metal wiring), so that two pairs of electrode pads are disposed in linear symmetry around the base center, so when a crystal plate is electromechanically joined to the pairs of electrode pads by a conductive joining material, the assembly can be carried out without worrying about directionality in mounting, and this makes the work easier. Also, with the package configuration disclosed in Patent Document 1, it is possible either for the crystal plate to be supported at just one end in the long-side direction, or for it to be supported at both ends in the long-side direction, which gives this configuration wider applicability.

Patent Document 1: Japanese Laid-Open Patent Application H7-235854

SUMMARY OF THE INVENTION PROBLEM TO BE SOLVED BY THE INVENTION

The above-mentioned packages used with piezoelectric resonator devices have been steadily decreasing in weight, thickness, and size in recent years, and a configuration in which the drive electrodes are moved closer to the ends of the piezoelectric resonator element and formed as large as possible, so as to ensure a good effective area, has come to be employed so as not to diminish the electrical characteristics of a piezoelectric resonator element such as its CI value or frequency sensitivity, when it is made smaller in size. However, when a piezoelectric resonator element with a configuration such as this is used for the package of the above-mentioned Patent Document 1, since there are electrode pads of the different potential in the long-side direction or the short-side direction, a problem is that the drive electrodes of the piezoelectric resonator element may short out by coming into contact with any of the electrode pads of the package. Forming the drive electrodes of the piezoelectric resonator element such that they will not short out with the electrode pads of the package not only imposes design limitations on the dimensions, but also leads to diminished electrical characteristics of the piezoelectric resonator element, and since misalignment and other such errors have to be factored in when mounting the piezoelectric resonator element in the package, such a package is very much at odds with the goal of reducing the size of the package.

The present invention was conceived in an effort to solve the above problems, and it is an object thereof to provide a piezoelectric resonator element package with which the size of a piezoelectric resonator element can be reduced without diminishing its electrical characteristics, and the piezoelectric resonator element can be supported at one or both ends. It is a further object to provide a piezoelectric resonator device with wide applicability.

Means for Solving Problem

To achieve the stated object, the piezoelectric resonator element package according to the present invention is a piezoelectric resonator element package having a base that holds a piezoelectric resonator element on the front and back sides on which are formed drive electrodes, and a cap for hermetically sealing the piezoelectric resonator element, with the piezoelectric resonator element being held on an internal bottom surface of the base, four electrode pads that electrically connect to the drive electrodes of the piezoelectric resonator element being formed on the internal bottom surface of the base, at least one of these electrode pads having the different potential, and avoidance means being provided for avoiding electrical connection between the electrode pad/pads with the different potential and the other electrode pad/pads with the same potential.

With the present invention, the base and the cap are provided, the four electrode pads are formed on the internal bottom surface of the base, at least one of the four electrode pads has the different potential, and an avoidance means is provided for avoiding electrical connection between the electrode pad/pads with the different potential and the other electrode pad/pads with the same potential, which makes it possible to suppress defects in a piezoelectric resonator device caused by short-circuiting between electrode pads of the same potential and an electrode pad of the different potential. As a result, a piezoelectric resonator element can be made smaller in size without diminishing its electrical characteristics, and the piezoelectric resonator element can be supported either at one end or at both ends.

The above constitution may be such that the four electrode pads are formed in the corners of the internal bottom surface of the base, the four electrode pads consist of a first electrode pad, second electrode pad, third electrode pad, and fourth electrode pad, the first electrode pad and the second electrode pad are formed along a predetermined specific side of the internal bottom surface of the base, the first electrode pad and the third electrode pad are formed along one of the two sides that are perpendicular to the specific side, the second electrode pad and the fourth electrode pad are formed along the other side that is perpendicular to the specific side, the first electrode pad and the second electrode pad have the different potential, the first electrode pad and the third electrode pad are connected by a first connecting electrode and have the same potential, the second electrode pad and the fourth electrode pad are connected by a second connecting electrode and have the same potential, and the avoidance means comprises bumps that are formed on the first to fourth electrode pads and are smaller than the electrode pads, and at least one of these bumps is formed at a location that does not overlap with the drive electrode formed on an opposite side opposed to the base of the piezoelectric resonator element.

In this case, the piezoelectric resonator element can be supported at one end by electrically connecting the pair of drive electrodes of the piezoelectric resonator element either to the first electrode pad and the second electrode pad formed along the specific side of the internal bottom surface of the base, or to the third electrode pad and the fourth electrode pad. Also, this piezoelectric resonator element can be supported at both ends by connecting the pair of drive electrodes of the piezoelectric resonator element either to the second electrode pad and the third electrode pad, or to the first electrode pad and the fourth electrode pad. As a result, it is possible to manufacture a piezoelectric resonator device with wide applicability.

Furthermore, since the piezoelectric resonator element is mounted on the first electrode pad, second electrode pad, third electrode pad, and fourth electrode pad formed in the corners of the internal bottom surface of the base, the piezoelectric resonator element can be supported in a more stable state, without being tilted or the like.

Also, bumps that are smaller than the electrode pads are formed on the four electrode pads at locations that do not overlap the location of the drive electrode on the opposite side of the piezoelectric resonator element from the base. Accordingly, even if the completed piezoelectric resonator device should be subjected to external impact so that the piezoelectric resonator element bends, the electrode pads will be prevented from coming into direct contact with the drive electrode on the opposite side from the base, so there will be no interruption in the resonator of the piezoelectric resonator element caused by short circuiting or the like.

Furthermore, since bumps that are formed on the first to fourth electrode pads and are smaller than the electrode pads, even if a reduction in the size of the piezoelectric resonator element package should impose size limitations on the piezoelectric resonator element, the adverse effect of misalignment will be eliminated during the mounting of the piezoelectric resonator element in this piezoelectric resonator element package, and the drive electrodes of the piezoelectric resonator element can be formed larger in the long-side direction or the short-side direction of the piezoelectric resonator element package, which means that the resulting piezoelectric resonator device will have higher reliability, and the electrical characteristics of the piezoelectric resonator element can be further enhanced.

With the above constitution, the base may be consisted of a ceramic material, the electrode pads may be formed by metallization, and bumps of the same material as the electrode pads may be provided on the electrode pads.

In this case, in addition to the effects discussed above, the bumps are layered over the upper parts of the electrode pads composed of metallization of the same material, and are integrally fired, which results in bumps of better adhesion and also allows them to be formed at the same time, so they can be formed extremely easily and efficiently.

With the above constitution, the electrode pads, the bumps, and the first and second connecting electrodes may be formed in point symmetry, with the center point being the center of the internal bottom surface of the base.

In this case, in addition to the effects discussed above, since the electrode pads, the bumps, and the first and second connecting electrodes are formed in point symmetry around the center point of the internal bottom surface of the base, the directionality of the base is eliminated in the manufacture of the base, so production efficiency is higher in the mounting of the piezoelectric resonator element.

The above constitution may be such that the avoidance means is configured such that electrode pad formation regions are formed in a corners of an internal bottom surface of the base for the formation of the four pads, an area capacity of the electrode pads fits within a four electrode pad formation regions for forming the electrode pads respectively, the area capacity of at least one of the electrode pads is set to be less than the area capacity of the other electrode pads, the four electrode pads consist of a first electrode pad, second electrode pad, third electrode pad, and fourth electrode pad, the first electrode pad and the second electrode pad are formed along a predetermined specific side of the internal bottom surface of the base, the first electrode pad and the third electrode pad are formed along one of the two sides that are perpendicular to the specific side, the second electrode pad and the fourth electrode pad are formed along the other side that is perpendicular to the specific side, the first electrode pad and the second electrode pad have the different potential, the first electrode pad and the third electrode pad are connected by a first connecting electrode and have the same potential, and the second electrode pad and the fourth electrode pad are connected by a second connecting electrode and have the same potential.

In this case, the piezoelectric resonator element can be supported at one end by electrically connecting the pair of drive electrodes of the piezoelectric resonator element to the first electrode pad and the second electrode pad formed along the specific side on the internal bottom surface of the base, or to the third electrode pad and the fourth electrode pad. Also, the piezoelectric resonator element can be supported at both ends by connecting the pair of drive electrodes of the piezoelectric resonator element to the second electrode pad and the third electrode pad, or to the first electrode pad and the fourth electrode pad. As a result, it is possible to manufacture a piezoelectric resonator device with wider applicability.

Furthermore, since electrode pad formation regions for forming the four electrode pads are formed in the corners of the internal bottom surface of the base, and the area capacity of the electrode pads fits within the four electrode pad formation regions, and the area capacity of at least one of the electrode pads is set to be less than the area capacity of the other electrode pads, even if the completed piezoelectric resonator device should be subjected to external impact so that the piezoelectric resonator element bends, the one or more electrode pads whose area capacity is set to be less than the area capacity of the other electrode pads will be prevented from coming into direct contact with the drive electrode of the piezoelectric resonator element on the opposite side from the base. As a result, there will be no interruption in the resonator of the piezoelectric resonator element caused by short circuiting or the like.

Furthermore, since the area capacity of at least one of the electrode pad is set to be less than the area capacity of the other electrode pads, even if a reduction in the size of the piezoelectric resonator element package should impose size limitations on the piezoelectric resonator element, the adverse effect of misalignment will be eliminated during the mounting of the piezoelectric resonator element in this piezoelectric resonator element package, and the drive electrodes of the piezoelectric resonator element can be formed larger in the long-side direction or the short-side direction of the piezoelectric resonator element package, which means that the resulting piezoelectric resonator device will have higher reliability, and the electrical characteristics of the piezoelectric resonator element can be further enhanced.

With the above constitution, the electrode pad with the smaller area capacity may be formed away from the other electrode pad formation regions within the electrode pad formation region in which this electrode pad is formed.

In this case, since the electrode pad with the smaller area capacity is formed away from the other electrode pad formation regions within the electrode pad formation region in which this electrode pad is formed, even if a reduction in the size of the piezoelectric resonator element package should impose size limitations on the piezoelectric resonator element, the adverse effect of misalignment will be eliminated during the mounting of the piezoelectric resonator element in this piezoelectric resonator element package, and this is also preferable in that the drive electrodes of the piezoelectric resonator element can be formed larger in the long-side direction or the short-side direction of the piezoelectric resonator element package.

With the above constitution, the first connecting electrode and the second connecting electrode may be formed with substantially the same area capacity.

In this case, in addition to the effects discussed above, because the first connecting electrode and second connecting electrode are formed with substantially the same area, it is possible to approximate the capacities from the electrode pads with the different potential of the base up to the terminal electrode connected to the outside, and the adverse effect such as the electrical characteristics varying (such as a slight difference in the resonator frequency) with the terminal direction can be eliminated.

Also, to achieve the stated object, the piezoelectric resonator according to the present invention is provided with the above-mentioned piezoelectric resonator element package and a piezoelectric resonator element on the front and back sides on which are formed drive electrodes, the piezoelectric resonator element is held on the internal bottom surface of the base, and the electrode pads of the base and the drive electrodes of the piezoelectric resonator element are electrically connected.

The piezoelectric resonator according to the present invention has the above-mentioned effects because the above-mentioned piezoelectric resonator element package and the above-mentioned piezoelectric resonator element are provided, and the piezoelectric resonator element is held on the internal bottom surface of the base, and the electrode pads of the base and the drive electrodes of the piezoelectric resonator element are electrically connected. Accordingly, it is possible to hold and mount the piezoelectric resonator element on the base without limiting the direction in which the piezoelectric resonator element is held on the internal bottom surface of the base. Also, even with a plurality of the above-mentioned piezoelectric resonator elements with different drive electrode patterns, the above-mentioned piezoelectric resonator element package can be used as a common piezoelectric resonator element package for the plurality of piezoelectric resonator elements.

With the above constitution, a front-side extraction electrode that is extracted from the drive electrode to both end regions at predetermined one end is formed on the front side of the piezoelectric resonator element, a back-side extraction electrode that is extracted from the drive electrode to both end regions at the other end opposite from the one end is formed on the back of the piezoelectric resonator element, the back-side extraction electrode and the electrode pads are electrically connected, and the back-side extraction electrode is electrically connected to the electrode pads that have the different potential from that of the electrode pads joined to the front-side extraction electrode.

In this case, because a front-side extraction electrode is formed on the front side of the piezoelectric resonator element, and a back-side extraction electrode is formed on the back of the piezoelectric resonator element, and the front-side extraction electrode and the electrode pads are electrically connected, and the back-side extraction electrode is electrically connected to the electrode pads that have the different potential from that of the electrode pads joined to the front-side extraction electrode, when the piezoelectric resonator element is held on the internal bottom surface of the base, even the piezoelectric resonator element should be held on the internal bottom surface of the base in a state in which the piezoelectric resonator element is backwards, the electrode pads joined to the front- and back-side extraction electrodes at a specific location will still have the different potential. Furthermore, no short circuiting or the like will occur with this constitution. As a result, greater freedom is afforded in how the piezoelectric resonator element is held in the base. Also, with this constitution, the effect thereof are particularly pronounced when electrode pad formation regions for the formation of the four electrode pads are formed in the corners of the internal bottom surface of the base, the area capacity of the electrode pads fits within the four electrode pad formation regions, and the area capacity of at least one of the electrode pads is set to be less than the area capacity of the other electrode pads. In other words, a secure connection can be achieved and production efficiency raised by arbitrarily designating the electrode pad that has the different potential and has a large capacity, as desired as the electrical connection location (joining location) with the front- and back-side extraction electrodes.

EFFECTS OF THE INVENTION

With the piezoelectric resonator element package according to the present invention, the size of a piezoelectric resonator element can be reduced without diminishing its electrical characteristics, and the piezoelectric resonator element can be supported either at one end or at both ends. As a result, a piezoelectric resonator device with wide applicability can be provided.

Figure 1:
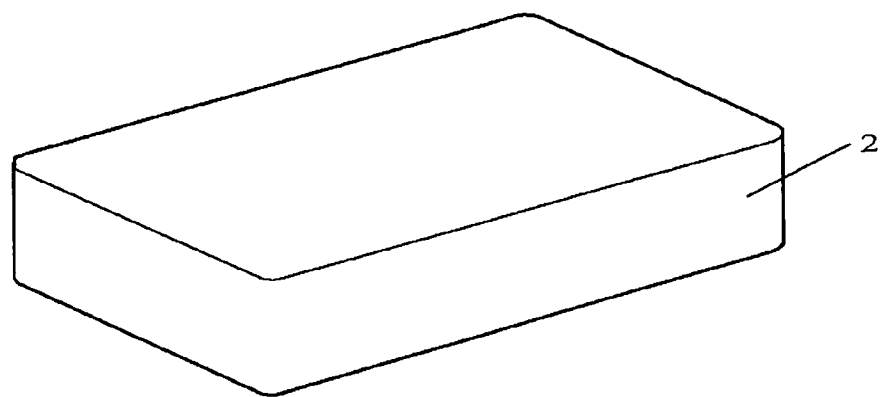
FIG. 1 is an exploded perspective view of a surface mount device of crystal resonator illustrating a first embodiment.
Figure 1:
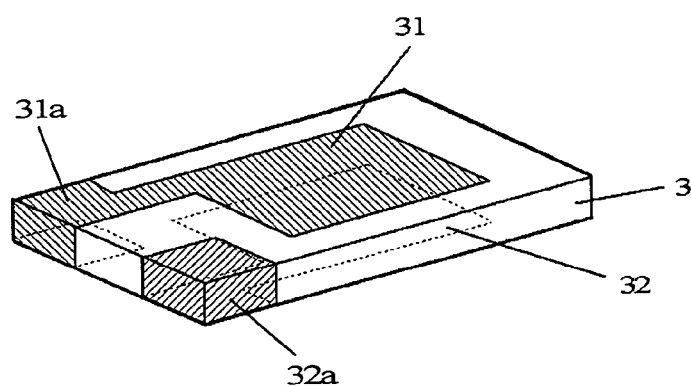
Figure 1:
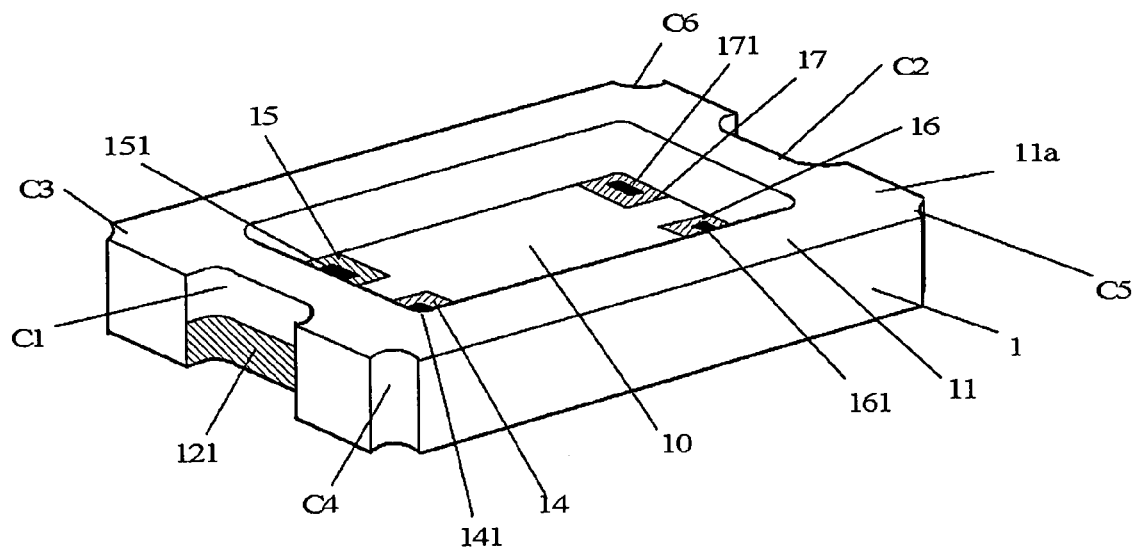

DESCRIPTION OF REFERENCE NUMERALS 1 base
14, 15, 16, 17 first to fourth electrode pads (electrode pads)
140 first connecting electrode
150 second connecting electrode
141, 151, 161, 171, B1, D1 bump
142, 152, 162, 172 electrode pad formation region
2 cap
3 crystal plate (piezoelectric resonator element)
31, 32 drive electrode

DETAILED DESCRIPTION OF PREFERRED EMBODIMENTS

Embodiments of the present invention will now be described through reference to the drawings. The following embodiments are cases of applying the present invention to a surface mount device of crystal resonator (hereinafter referred to as crystal resonator) as a piezoelectric resonator device.

First Embodiment

Figure 2:
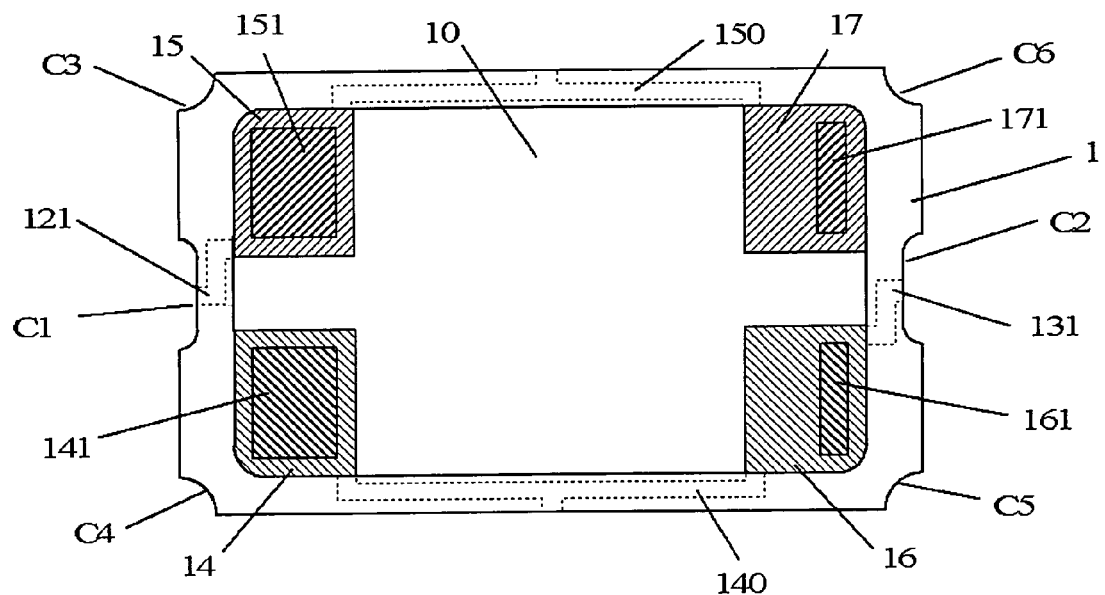
FIG. 2 is a plan view of the base in FIG. 1.
Figure 3:
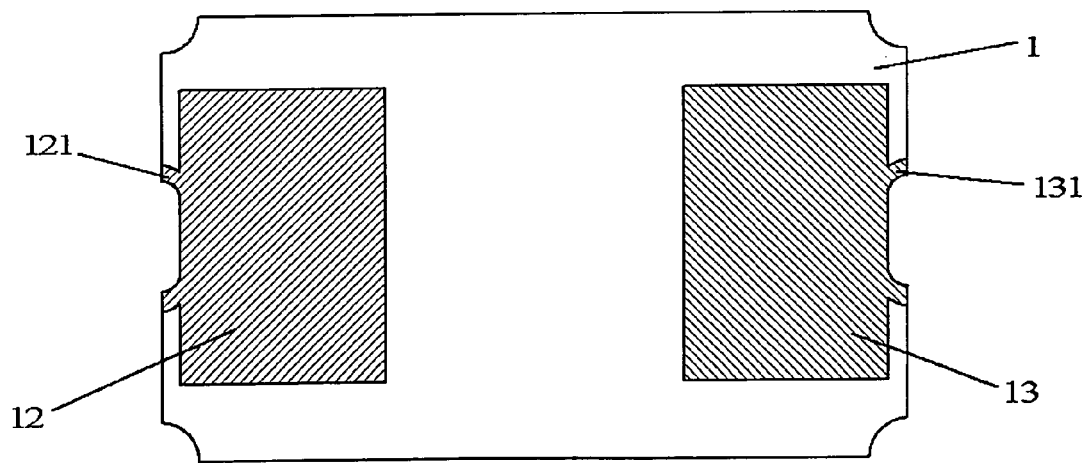
FIG. 3 is a bottom view of the base shown in FIG. 2.
Figure 4:
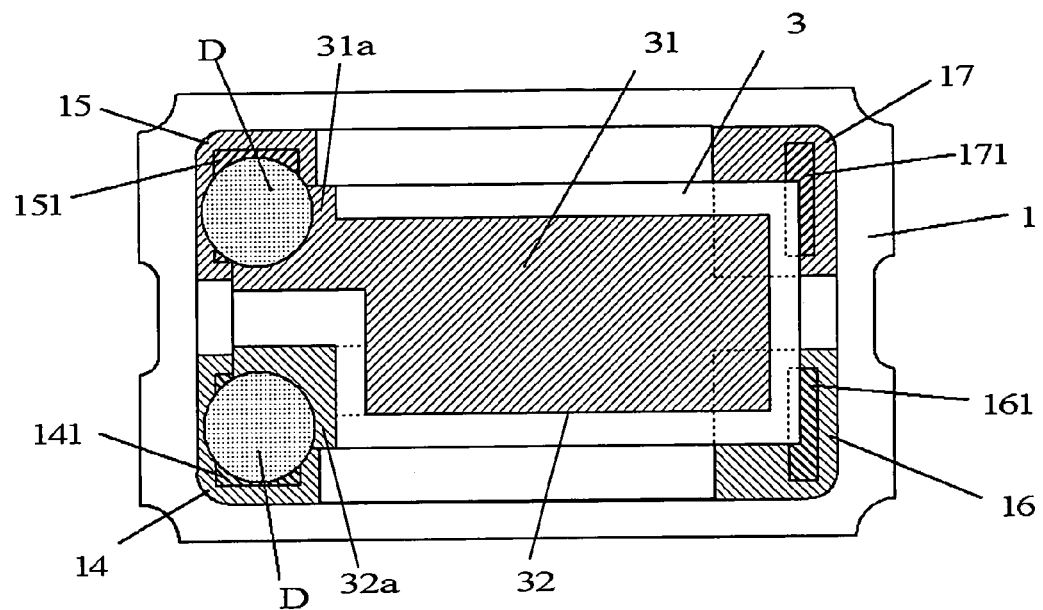
FIG. 4 is a plan view of the state in which the crystal plate of FIG. 2 is supported at one end.
Figure 5:
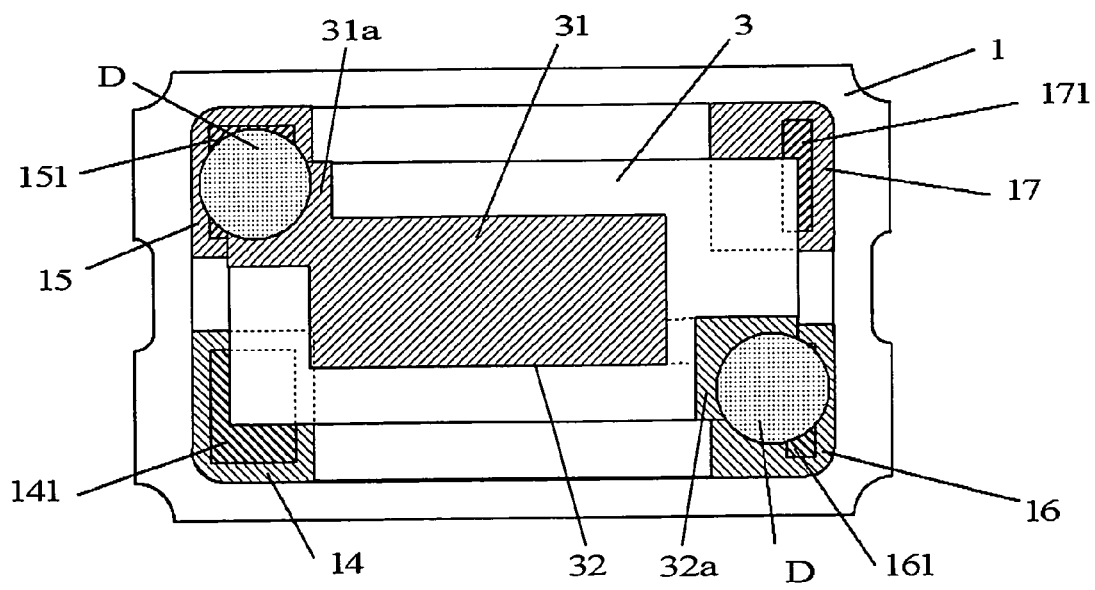
FIG. 5 is a plan view of the state in which the crystal plate of FIG. 2 is supported at both ends.

A first embodiment according to the present invention will be described through reference to the drawings, using a surface mount device of crystal resonator as an example. FIG. 1 is an exploded perspective view of a surface mount device of crystal resonator illustrating a first embodiment, FIG. 2 is a plan view of the base in FIG. 1, and FIG. 3 is a bottom view of the base shown in FIG. 2. FIG. 4 is a plan view of the state in which the crystal plate of FIG. 2 is supported at one end, and FIG. 5 is a plan view of the state in which the crystal plate of FIG. 2 is supported at both ends.

As shown in FIG. 1, the crystal resonator has a base 1 that holds a crystal plate (called a piezoelectric resonator element in the present invention) 3 having drive electrodes 31 and 32 formed on its front and back sides, and a cap 2 that hermetically seals the crystal plate 3. More specifically, the crystal resonator according to this first embodiment comprises the base 1, which is rectangular in plan view and has an open recess at the top, the crystal plate 3, which is held on an internal bottom surface of the base 1 (see the receptacle 10 discussed below), and the cap 2, which is joined to the opening of the base 1. The crystal plate 3 comprises the drive electrodes 31 and 32 formed on its front and back sides, and extraction electrodes 31a and 32a that are extracted from the drive electrodes 31 and 32 to electrically connect these drive electrodes 31 and 32 with external electrodes.

The base 1 is, for example, consisted of an alumina ceramic material, and comprises a base bottom that is rectangular in plan view, and a frame whose external size is substantially the same as that of the base bottom, but which has a large hole made in its center portion. These layers are laminated and integrally fired. After the firing for molding, a glass layer 11a is formed on the upper surface of the frame by baking or another such method. That is, the base 1 is configured such that it has a receptacle 10 that is concave in cross section and holds the crystal plate 3. The glass layer 11a is formed all the way round and over a bank 11 encircling the recess. The base 1 and the cap 2 can be hermetically sealed even without forming the glass layer 11a, but forming the glass layer 11a increases the joining strength. Castellations C1 and C2 are formed in the center portion of both ends in the long-side direction at the top and bottom of the outer periphery of the base 1, and castellations C3, C4, C5, and C6 are formed in the four corners. Linking electrodes 121 and 131 are formed beneath the castellations C1 and C2, and are electrically connected to terminal electrodes 12 and 13 that are connected to the outside (see FIG. 3).

As shown in FIGS. 2 and 3, four electrode pads 14, 15, 16, and 17 that electrically connect to the drive electrodes 31 and 32 of the crystal plate 3 are formed in the corners on the internal bottom surface of the base 1 (see the receptacle 10). These four electrode pads consist of a first electrode pad 14, second electrode pad 15, third electrode pad 16, and fourth electrode pad 17.

The first electrode pad 14 and the second electrode pad 15 are formed along a predetermined specific side on the internal bottom surface of the base 1 (in the short-side direction in this embodiment). The first electrode pad 14 and the third electrode pad 16 are formed along one of the two long sides that are perpendicular to the short-side direction. The second electrode pad 15 and the fourth electrode pad 17 are formed along the other long side that is perpendicular to the short-side direction. These electrode pads 14, 15, 16, and 17 are extended to the bottom surface of the base 1 via the linking electrodes 121 and 131 and the castellations C1 and C2, and are electrically connected to the terminal electrodes 12 and 13 formed on the bottom surface of the base 1.

The first electrode pad 14 and the second electrode pad 15 are extended to the terminal electrode 12 or the terminal electrode 13 on the bottom surface of the base, electrically independently, so that current can be applied at the different potential. The first electrode pad 14 and the third electrode pad 16 are connected in common by a first connecting electrode 140 and extended to the terminal electrode 13 on the base bottom so that current can be applied at the same potential. The second electrode pad 15 and the fourth electrode pad 17 are connected in common by a second connecting electrode 150 and extended to the terminal electrode 12 on the base bottom so that current can be applied at the same potential. The first and second connecting electrodes 140 and 150 are formed in substantially the same shape and with substantially the same area, so it is possible to approximate the capacities from the electrode pads with the different potential of the base up to the terminal electrode connected to the outside. Therefore, the adverse effect such as the electrical characteristics varying (such as a slight difference in the resonator frequency) with the terminal direction can be eliminated. The terminal electrodes, linking electrodes, electrode pads, and connecting electrodes are formed by printing with tungsten, molybdenum, or another such metallization material and then integrally firing this product together with the base, and with part of these, nickel plating is formed over the metallization, over which gold plating is formed.

The crystal resonator constituted as above is provided with avoidance means for avoiding electrical connection between the first electrode pad 14 and the third electrode pad 16, which have the same potential, and the second electrode pad 15 and the fourth electrode pad 17, which have the different potential from that of the first and third electrode pads.

The avoidance means comprises bumps 141, 151, 161, and 171 that are formed on the first to fourth electrode pads 14, 15, 16, and 17 and are smaller than the first to fourth electrode pads 14, 15, 16, and 17. As shown in FIG. 2, these bumps 141, 151, 161, and 171 are formed on the first to fourth electrode pads 14, 15, 16, and 17, respectively, and at locations that do not overlap with the drive electrode 32 formed on the opposite side opposed to the base 1 of the crystal plate 3 when the crystal plate 3 is installed and held in the base 1.

More specifically, the bumps 141, 151, 161, and 171 are formed at locations that overlap with part of the outer peripheral edge of the crystal plate 3 and part of the extraction electrodes 31a and 32a of the crystal plate 3 and that do not overlap with the drive electrode 32 on the opposite side of the crystal plate 3 from the base 1, and at locations that overlap with part of the outer peripheral edge of the crystal plate 3 and that do not overlap with the drive electrode 32 on the opposite side of the crystal plate 3 from the base 1. The bumps 141, 151, 161, and 171 are made of the same material as the first to fourth electrode pads 14, 15, 16, and 17.

In other words, when the crystal plate 3 shown in FIG. 4 is used, the bumps 141 and 151 formed on the first and second electrode pads 14 and 15 are only in contact with part of the extraction electrodes 31a and 32a and the outer peripheral edge of the crystal plate 3, and are not in direct contact with the drive electrode 32 on the back side of the crystal plate 3 (the opposite side from the base 1). When the crystal plate 3 shown in FIG. 5 is used, the bumps 151 and 161 formed on the second and third electrode pads 15 and 16 are only in contact with part of the extraction electrodes 31a and 32a and the outer peripheral edge of the crystal plate 3, and are not in direct contact with the drive electrode 32 on the back side of the crystal plate 3 (the opposite side from the base 1). Accordingly, the bumps 161 and 171 (the case in FIG. 4) or the bumps 141 and 171 (the case in FIG. 5) formed on electrode pads not electrically connected to the crystal plate 3 do not come into direct contact with the drive electrode 32 (on the opposite side from the base 1) although they do come into contact with the outer peripheral edge of the crystal plate 3. More specifically, in the case of the crystal plate 3 shown in FIGS. 4 and 5, the bump 171 formed on the fourth electrode pad 17 is only in contact with the outer peripheral edge of the crystal plate 3, and the fourth electrode pad 17 is not in direct contact with the different-voltage drive electrode 32 via the bump 171. Accordingly, interruption in the resonator of the crystal plate 3 caused by short circuiting or the like can be eliminated.

Using FIG. 4 as an example, when the crystal plate 3 is connected with a conductive joining material D, since the extraction electrodes 31a and 32a are located where the bumps 141 and 151 rise up, the extraction electrodes 31a and 32a and the first and second electrode pads 14 and 15 can be reliably connected via the bumps 141 and 151. Furthermore, since the conductive joining material D builds up in the gaps between the bumps 141 and 151 and the first and second electrode pads 14 and 15, and there is an increase in the joining area, the joining strength can be increased between the crystal plate 3 and the first and second electrode pads 14 and 15 of the base 1.

Also, even if the completed crystal resonator should be subjected to external impact so that the crystal plate 3 bends, the bumps 161 and 171 will come into contact with the outer peripheral edge of the crystal plate 3, and the third and fourth electrode pads 16 and 17 will be prevented from coming into direct contact with the drive electrode 32 on the opposite side from the base 1 by the size of the gap between the third and fourth electrode pads 16 and 17 and the bumps 161 and 171, so there will be no interruption in the resonator of the crystal plate 3 caused by short circuiting or the like.

Also, with this embodiment, for the first and second electrode pads 14 and 15 on one end in the long-side direction that do not extend into the region of the drive electrode 32 of the mounted crystal plate 3, the bumps 141 and 151 have a rectangular shape that is slightly smaller and corresponds to the shape of the first and second electrode pads 14 and 15, whereas for the third and fourth electrode pads 16 and 17 on the other end in the long-side direction that do extend into the region of the drive electrode 32 of the mounted crystal plate 3, the bumps 161 and 171 have a rectilinear shape that is close to the outside of the base 1, the result being that even if the drive electrode 32 of the crystal plate 3 is formed larger toward the other end in the long-side direction, the bumps 161 and 171 will not extend into the region of the rectangular drive electrode 32, and the crystal plate 3 can be mounted in a shape corresponding to the outer peripheral edge of the rectangular crystal plate 3.

The formation of these bumps 141, 151, 161, and 171 is achieved by first printing metallization of the first to fourth electrode pads 14, 15, 16, and 17. Once the metallization of the first to fourth electrode pads 14, 15, 16, and 17 has dried, metallization of the bumps 141, 151, 161, and 171 is formed by printing over the first to fourth electrode pads 14, 15, 16, and 17 according to the shapes of the bumps 141, 151, 161, and 171. Next, the first to fourth electrode pads 14, 15, 16, and 17 and the bumps 141, 151, 161, and 171 are integrally fired while in this laminated state, which forms the metallization of these. Nickel plating is then formed as discussed above over the top of the metallization of the first to fourth electrode pads 14, 15, 16, and 17 and the bumps 141, 151, 161, and 171. The bumps 141, 151, 161, and 171 are formed by forming gold plating over the top of this nickel plating.

The rectangular crystal plate 3 is mounted over the top of the first to fourth electrode pads 14, 15, 16, and 17. The pair of drive electrodes 31 and 32 is then formed on the front and back sides of the crystal plate 3 in the order of chrome and then gold, or the order of chrome, gold, and chrome, or the order of chrome, silver, and chrome.

As shown in FIG. 4, when this crystal plate 3 is supported at one end, the drive electrodes 31 and 32 of the crystal plate 3 are extracted in the direction of the first and second electrode pads 14 and 15 of the base 1, and the electrode portions of the crystal plate 3 that are extracted are conductively joined with the first and second electrode pads 14 and 15 by a silicone-based conductive joining material D, for instance. Here, the first electrode pad 14 of the base 1 is electrically connected with the drive electrode 32 on the back side of the crystal plate (the opposite side from the base 1), and the second electrode pad 15 of the base 1 is electrically connected with the drive electrode 31 on the front side of the crystal plate 3 (the opposite side from the cap 2). Also, as discussed above, when the first and second electrode pads 14 and 15 and the crystal plate 3 are joined by the conductive joining material D, the third and fourth electrode pads 16 and 17 and the crystal plate 3 function as cushioning materials without being electromechanically joined while having a specific gap therebetween.

As shown in FIG. 5, when the crystal plate 3 is supported at both ends, the drive electrodes 31 and 32 are extracted in the direction of the second and third electrode pads 15 and 16 of the base 1, and the electrode portions of the crystal plate 3 that are extracted are conductively joined with the first and second electrode pads 14 and 15 by a silicone-based conductive joining material D, for instance. Here, the third electrode pad 16 of the base 1 is electrically connected with the drive electrode 32 on the back side of the crystal plate (the opposite side from the base 1), and the second electrode pad 15 is electrically connected with the drive electrode 31 on the front side of the crystal plate (the opposite side from the cap 2). Also, as discussed above, when the second and third electrode pads 15 and 16 and the crystal plate 3 are joined by the conductive joining material D, the first and fourth electrode pads 14 and 17 and the crystal plate 3 function as cushioning materials without being electromechanically joined while having a specific gap therebetween.

The cap 2 that hermetically seals the base 1 an inverted concave shape that is open on the lower side, and is composed of an alumina ceramic material or a ceramic glass material, for example. Although not depicted, a glass material with a low melting point, such as one based on lead, bismuth, or tin-phosphoric acid, is formed as a sealing and joining material at the joint face of the cap 2.

The glass material formed on the cap 2 is melted to form a hermetic seal by heating the joint of the base 1 and the cap 2 to a specific temperature. This hermetic sealing work may be performed all at once for many packages, using a pallet provided with a matrix of receptacles so that the caps 2 will be properly positioned and sealed by its own weight. A weight may also be placed on the base 1 to accelerate the joining of the base 1 and the cap 2. Also, in the above embodiment the glass joining material was formed at the joining regions of both the base 1 and the cap 2, but may instead be formed on just the base 1 or the cap 2. The above completes the surface mount device of crystal resonator.

A preferred aspect for the crystal plate 3, in which there is less effect of frequency, is to place it on the base 1 by bonding it to the base 1 in the Z axis direction.

Furthermore, this first embodiment involved the use of a base 1 that was rectangular in plan view and had an open recess at its top, and a cap 2 that was joined to the opening in the base 1, but the present invention is not limited to this, and any configuration can be employed so long as it allows the crystal plate 3 to be hermetically sealed by the base 1 and the cap 2. For instance, a parallelepiped base whose top portion consists of a flat surface, and a cap having an open recess at the bottom may be used.

Also, in this first embodiment a predetermined specific side of the internal bottom surface of the base 1 was used as the short-side direction, but may instead be used as the long-side direction.

Also, in this first embodiment the internal bottom surface of the base 1 was formed flat, but is not limited to this, and may instead have a stepped portion. For instance, an upper layer may be provided on the base bottom, and the four electrode pads formed over this upper layer (see the third embodiment below).

Also, a glass material was used as an example of the sealing and joining material in the first embodiment above, but a resin or the like may be used instead. Furthermore, a metal cap may be used on a ceramic base, and laser sealing, electron beam sealing, seam sealing, or another such process involving the use of silver braze or another such braze for the sealing and joining material can be applied.

Also, a surface mount device of a crystal resonator was used as an example in the first embodiment above, but the present invention can also be applied to other surface mount piezoelectric resonator devices used in electronic devices such as crystal filters and crystal oscillators.

Second Embodiment

Figure 6:
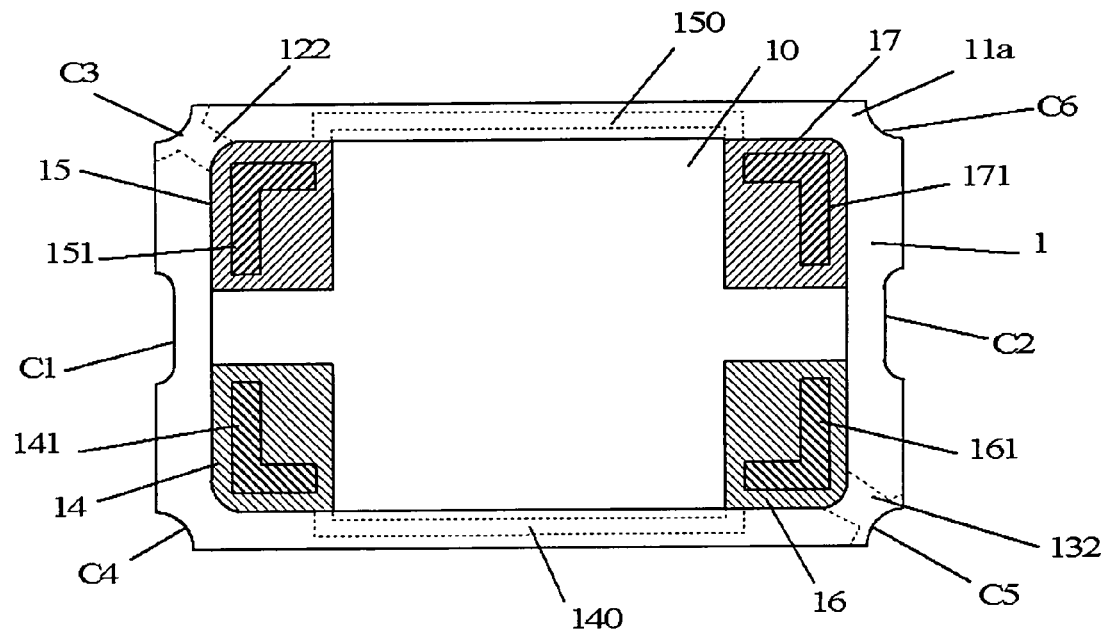
FIG. 6 is a plan view of the base of a surface mount device of crystal resonator illustrating a second embodiment.
Figure 7:
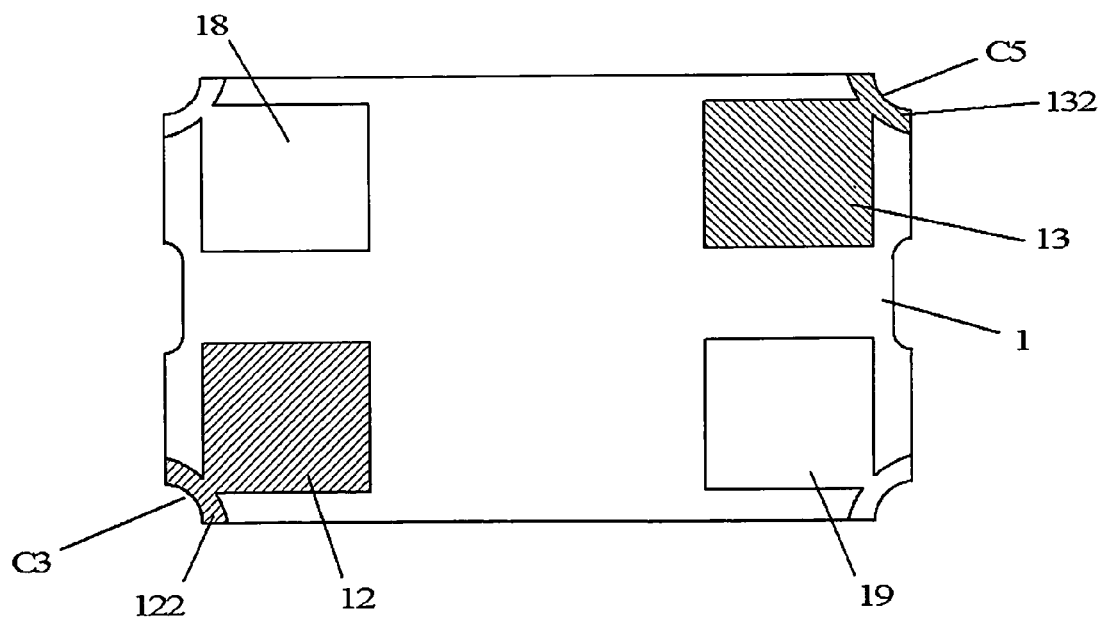
FIG. 7 is a bottom view of the base shown in FIG. 6.

A second embodiment according to the present invention will be described through reference to the drawings, using a surface mount device of crystal resonator as an example. FIG. 6 is a plan view of the base, and illustrates the second embodiment, while FIG. 7 is a bottom view of the base shown in FIG. 6. The second embodiment differs from the first embodiment only in the take-off configuration of the terminal electrodes and linking electrodes. Accordingly, components that are the same will be numbered the same, and only the differences will be described. Therefore, all effects and modifications according to the same configuration will be the same as those of the first embodiment given above.

The base 1 is configured such that it has a receptacle 10 that is concave in cross section, and a glass layer 11a is formed all the way around and over a bank 11 encircling the recess. Terminal electrodes 12, 13, 18, and 19 (the terminal electrodes 18 and 19 are used as dummy connecting electrodes) are formed in the four corners of the bottom surface of the base 1. Castellations C1 and C2 are formed in the center portion of both ends in the long-side direction at the top and bottom of the outer periphery of the base 1, and castellations C3, C4, C5, and C6 are formed in the four corners. Linking electrodes 122 and 132 are formed beneath the castellations C3 and C5, and are electrically connected to terminal electrodes 12 and 13 that are connected to the outside. In this embodiment, the terminal electrodes 18 and 19 are used as dummy connecting electrodes, but may instead be used as ground electrodes.

As shown in FIGS. 6 and 7, first to fourth electrode pads 14, 15, 16, and 17 are formed at both ends in the short-side direction and both ends in the long-side direction, respectively, on the internal bottom surface of the base 1 (see the receptacle 10), and these first to fourth electrode pads 14, 15, 16, and 17 are electrically extended to the terminal electrodes 12 and 13 formed on the bottom surface of the base 1 via the linking electrodes 122 and 132 and the castellations C3 and C5. The first electrode pad 14 and the second electrode pad 15 that face each other in the short-side direction are extended electrically independently to the terminal electrodes 12 and 13 on the bottom surface of the base 1 so that current can be applied at the different potential, and the first electrode pad 14 and the third electrode pad 16 that face each other in the long-side direction are connected in common by a first connecting electrode 140 and extended to the terminal electrode 13 on the bottom surface of the base 1 so that current can be applied in the same potential. Also, the second electrode pad 15 and the fourth electrode pad 17 that face each other in the long-side direction are connected in common by a second connecting electrode 150 and extended to the terminal electrode 12 on the bottom surface of the base 1 so that current can be applied in the same potential. Since the first and second connecting electrodes 140 and 150 are formed in substantially the same area and the same shape, it is possible to approximate the capacities from the electrode pads with the different potential of the base up to the terminal electrode connected to the outside, and the adverse effect such as the electrical characteristics varying (such as a slight difference in the resonator frequency) with the terminal direction can be eliminated. The terminal electrodes 12 and 13, linking electrodes 122 and 132, first to fourth electrode pads 14, 15, 16, and 17, connecting electrodes 140 and 150, and dummy connecting electrodes 18 and 19 are formed by printing with tungsten, molybdenum, or another such metallization material and then integrally firing this product together with the base, and with part of these, nickel plating is formed over the metallization, over which gold plating is formed.

The bumps 141, 151, 161, and 171, which are made of the same material as the first to fourth electrode pads 14, 15, 16, and 17, are formed at the top parts of the first to fourth electrode pads 14, 15, 16, and 17 at locations where they come into contact with the outer peripheral edge of the crystal plate 3 (not shown), but do not come into direct contact with the drive electrode 32 on the back side (the opposite side from the base 1). In the case of this second embodiment, the bumps 141, 151, 161, and 171 are approximately L-shaped, so even if the drive electrode 31, 32 of the crystal plate 3 is formed larger toward the other end in the long-side direction, the bumps 141, 151, 161, and 171 will not extend into the region of the rectangular drive electrode 32 (the opposite side from the base 1), and the crystal plate 3 can be mounted in a shape corresponding to the outer peripheral edge of the rectangular crystal plate 3.

Also, the first to fourth electrode pads 14, 15, 16, and 17, the bumps 141, 151, 161, and 171, and the first and second connecting electrodes 150 and 160 are formed in point symmetry, with the center point being the center of the internal bottom surface of the base 1 (see the receptacle 10). Accordingly, the directionality of the base 1 is eliminated in the manufacture of the base 1, and manufacture is facilitated in the mounting of the crystal plate 3.

When these bumps 141, 151, 161, and 171 are formed, metallization of the first to fourth electrode pads 14, 15, 16, and 17 is formed by printing. Once the metallization of the first to fourth electrode pads 14, 15, 16, and 17 has dried, the bumps 141, 151, 161, and 171 are formed by printing over the first to fourth electrode pads 14, 15, 16, and 17 according to the shapes of the bumps. Next, the first to fourth electrode pads and the bumps are formed simultaneously by integrally firing them while being laminated. Nickel plating is then formed as discussed above over the top of the metallization, and gold plating is formed over the top of this nickel plating.

When these bumps 141, 151, 161, and 171 are formed, metallization of the first to fourth electrode pads 14, 15, 16, and 17 is formed by printing. Once the metallization of the first to fourth electrode pads 14, 15, 16, and 17 has dried, metallization of the bumps 141, 151, 161, and 171 is formed by printing over the first to fourth electrode pads 14, 15, 16, and 17 according to the shapes of the bumps 141, 151, 161, and 171. Next, the first to fourth electrode pads 14, 15, 16, and 17 and the bumps 141, 151, 161, and 171 are integrally fired while in this laminated state, which forms the metallization of these. Nickel plating is then formed as discussed above over the top of the metallization of the first to fourth electrode pads 14, 15, 16, and 17 and the bumps 141, 151, 161, and 171. The bumps 141, 151, 161, and 171 are formed by forming gold plating over the top of this nickel plating.

Figure 8:
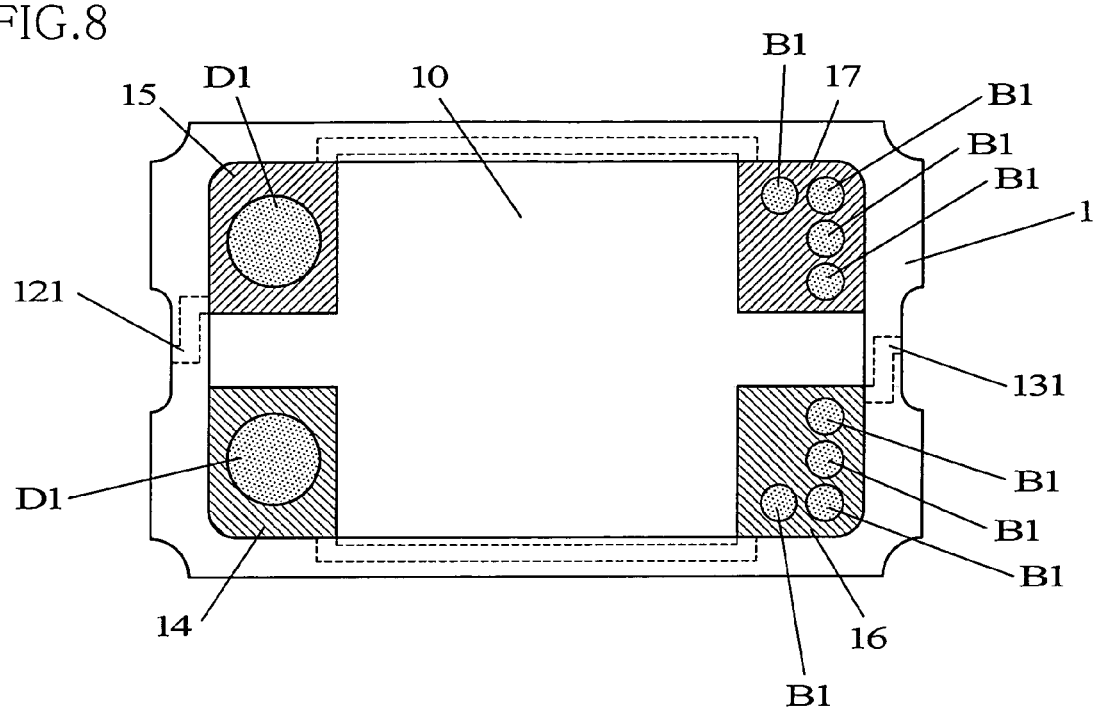
FIG. 8 is a plan view of the base in a variation of the second embodiment.

In the first and second embodiments above, the example given is one in which the bumps 141, 151, 161, and 171 are substantially L-shaped, rectangular, or rectilinear and are made of the same material as the first to fourth electrode pads 14, 15, 16, and 17, but the present invention is not limited to this, and as shown in FIG. 8, dot-shaped bumps B1 may be formed, or bumps D1 composed of another material such as a conductive adhesive may be formed over the upper parts of the first to fourth electrode pads 14, 15, 16, and 17.

Third Embodiment

Figure 9:
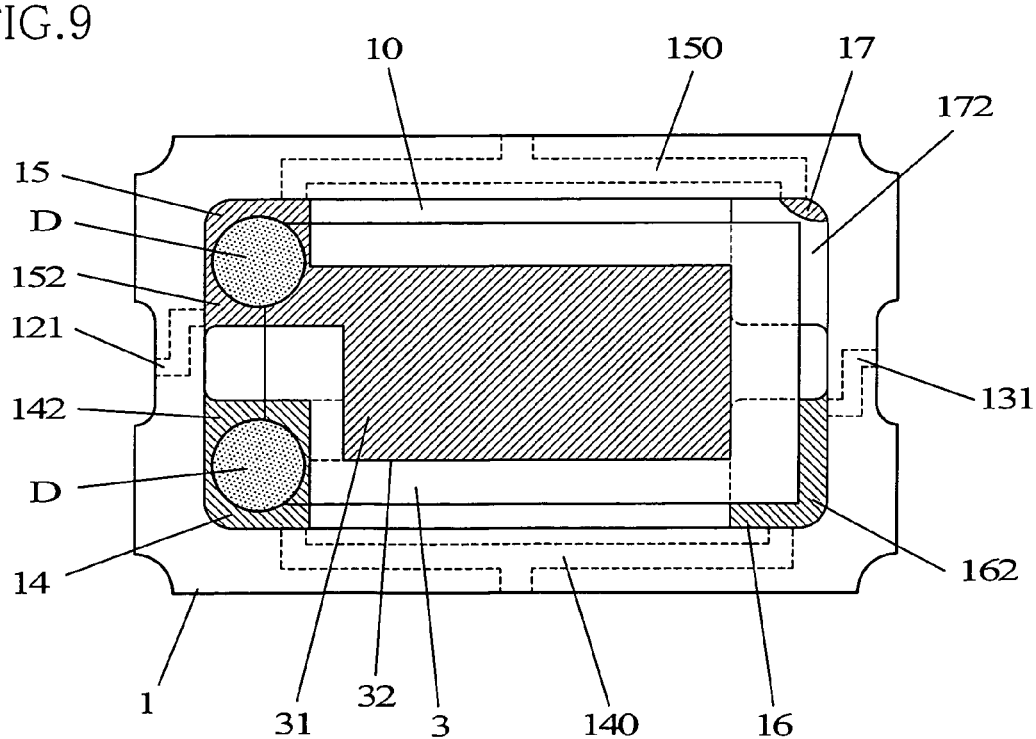
FIG. 9 is a plan view of the base of a surface mount device of crystal resonator illustrating a third embodiment.

A third embodiment according to the present invention will be described through reference to the drawings, using a surface mount device of crystal resonator as an example. FIG. 9 is a base plan view illustrating the third embodiment. The third embodiment differs from the first embodiment only in the shape of the base and the avoidance means. Accordingly, components that are the same will be numbered the same, and only the differences will be described. Therefore, all effects and modifications according to the same configuration will be the same as those of the third embodiment given above.

The base 1 according to this embodiment is, for example, composed of an alumina ceramic material, comprises a base bottom that is rectangular in plan view, and a frame whose external size is substantially the same as that of the base bottom, but which has a large hole made in its center portion, and has a stepped portion laminated over the base bottom. These layers are laminated and integrally fired.

The avoidance means according to this third embodiment comprises electrode pad formation regions 142, 152, 162, and 172 for forming the first to fourth electrode pads 14, 15, 16, and 17 in the corners on the internal bottom surface of the base 1 (see the receptacle 10). These electrode pad formation regions 142, 152, 162, and 172 are formed at the stepped portion of the base 1.

The area capacity of the first to fourth electrode pads 14, 15, 16, and 17 is set to fit within the electrode pad formation regions 142, 152, 162, and 172, and the area capacity of at least one of the first to fourth electrode pads 14, 15, 16, and 17 is set to be smaller than the area capacity of the other electrode pads. In this third embodiment, as shown in FIG. 9, the area capacity of the fourth electrode pad 17 is set to be smaller than the area capacity of the first to third electrode pads 14, 15, and 16. The area capacity of the first to third electrode pads 14, 15, and 16 is set the same for all three.

The fourth electrode pad 17 is formed at a location away from the other electrode pad formation regions 142, 152, and 162 within the electrode pad formation region 172 where the fourth electrode pad 17 is formed.

As discussed above, with this third embodiment, the electrode pad formation regions 142, 152, 162, and 172 are formed and the area capacity of the fourth electrode pad 17 is set to be smaller than the area capacity of the first to third electrode pads 14, 15, and 16, so even if the completed crystal resonator should be subjected to external impact so that the crystal plate 3 bends, the fourth electrode pad 17 will be prevented from coming into direct contact with the drive electrode 32 of the crystal plate 3 on the opposite side from the base 1. As a result, there will be no interruption in the resonator of the crystal plate 3 caused by short circuiting or the like.

Also, since the area capacity of the fourth electrode pad 17 is set to be smaller than the area capacity of the first to third electrode pads 14, 15, and 16, even if a reduction in the size of the piezoelectric resonator element package should impose size limitations on the crystal plate 3, the adverse effect of misalignment will be eliminated during the mounting of the crystal plate 3 in this crystal plate package, and the drive electrodes of the crystal plate 3 can be formed larger in the long-side direction or the short-side direction of the crystal plate package, which means that the resulting piezoelectric resonator device will have higher reliability, and the electrical characteristics of the crystal plate 3 can be further enhanced.

Also, since the fourth electrode pad 17 is formed at a location away from the other electrode pad formation regions 142, 152, and 162 within the electrode pad formation region 172 where the fourth electrode pad 17 is formed, even if a reduction in the size of the piezoelectric resonator element package should impose size limitations on the crystal plate 3, the adverse effect of misalignment will be eliminated during the mounting of the crystal plate 3 in this crystal plate 3 package, and the drive electrodes of the crystal plate 3 can be formed larger in the long-side direction or the short-side direction of the crystal plate package, which is favorable. However, the location within the electrode pad formation region 172 shown in FIG. 9 is just a favorable example, and the fourth electrode pad 17 may be, for instance, formed at the location within the electrode pad formation region 172 shown in FIG. 9.

As discussed above, in this third embodiment, the area capacity of the fourth electrode pad 17 is set to be smaller than the area capacity of the first to third electrode pads 14, 15, and 16, but the present invention is not limited to this, and the area capacity of at least one of the first to third electrode pads 14, 15, and 16 may be set smaller than the area capacity of the other first to fourth electrode pads 14, 15, 16, and 17.

Also, in this third embodiment, the area capacity of the first to third electrode pads 14, 15, and 16 is set to be the same for all three, but the present invention is not limited to this. Specifically, as long as the area capacity of at least one electrode pad is set to be smaller than the area capacity of the other electrode pads, the first to fourth electrode pads 14, 15, 16, and 17 may have different area capacities.

Also, in this third embodiment, there is a stepped portion, but the base 1 may comprise only a base bottom and a frame, just as with the base 1 in the first embodiment discussed above. In this case, the electrode pad formation regions 142, 152, 162, and 172 are formed at the desired locations on the base 1.

In the first to third embodiments above, the base 1 was rectangular in plan view, as shown in FIGS. 4, 6, and 9, but a base 1 that is square in plan view may be used instead.

Also, in the first to third embodiments above, the crystal plate 3 shown in FIGS. 1, 4, 5, and 9 was used, but the present invention is not limited to this, and the drive electrodes 31 and 32 and the extraction electrodes 31a and 32a may be set as desired. For instance, the crystal plate 3 shown in FIG. 10 may be used.

Figure 10:
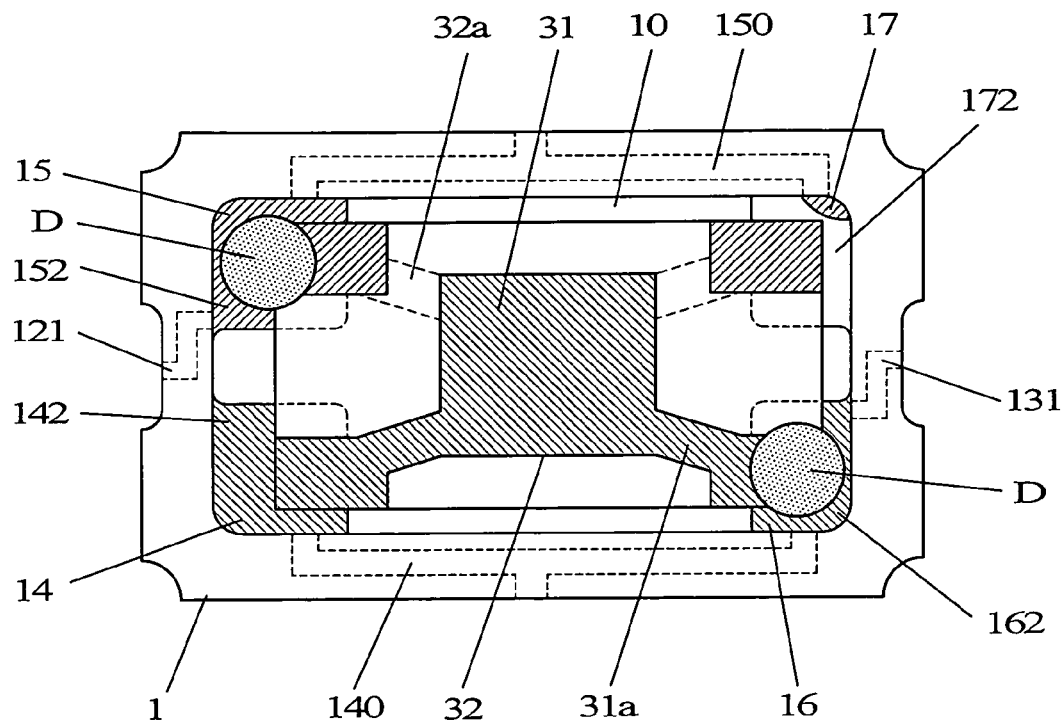
FIG. 10 is a plan view of a piezoelectric resonator element according to another embodiment.
Figure 11:
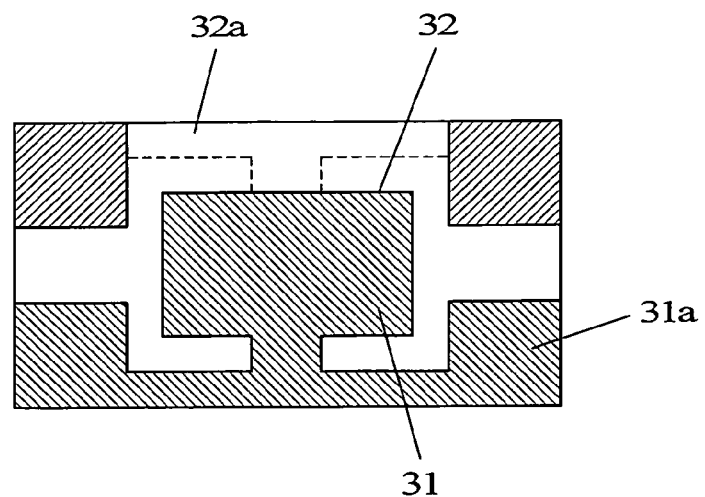
FIG. 11 is a plan view of a piezoelectric resonator element according to another embodiment.
Figure 12:
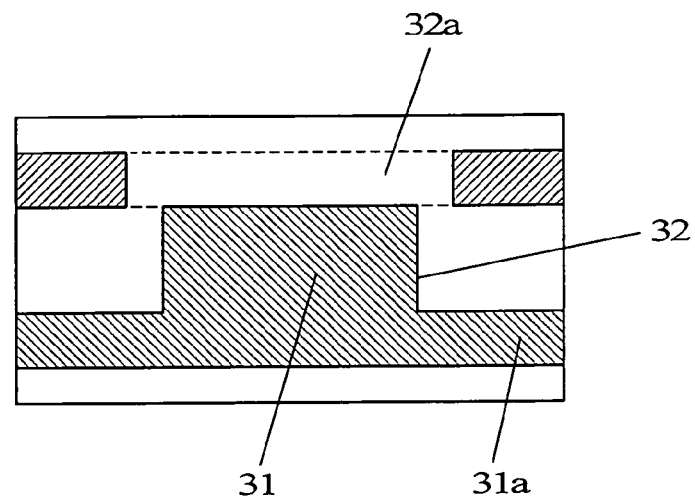
FIG. 12 is a plan view of a piezoelectric resonator element according to another embodiment.

The crystal plate 3 shown in FIG. 10 is held in a base 1 having the same configuration as the base 1 shown in FIG. 9. A front-side extraction electrode 31a that is extracted from the drive electrode 31 to both end regions at one predetermined specific end (in FIG. 10, the two ends on the lower side of the crystal plate 3 shown in the drawing) is formed on the front side of the crystal plate 3. A back-side extraction electrode 32a that is extracted from the drive electrode 32 to both end regions at the other end opposite the above-mentioned one end (in FIG. 10, the two ends on the upper side of the crystal plate 3 shown in the drawing) is formed on the back side of the crystal plate 3. The front-side extraction electrode 31a and the third electrode pad 16 are electrically connected using the conductive joining material D, and the back-side extraction electrode 32a and the second electrode pad 15 are electrically connected using the conductive joining material D. Also, the above-mentioned crystal plate 3 shown in FIG. 10 is not limited to the pattern of the drive electrodes 31 and 32 and the extraction electrodes 31a and 32a shown in FIG. 10, and may, for instance, have the patterns of the drive electrodes 31 and 32 and the extraction electrodes 31a and 32a shown in FIGS. 11 and 12.

As discussed above, when the crystal plate 3 shown in FIGS. 10 to 12 and the base 1 shown in FIG. 10 are used for a crystal resonator, even if the crystal plate 3 is held on the internal bottom surface of the base 1 (see the receptacle 10) at both the ends in a state in which the crystal plate 3 is backwards, the electrode pads are always be connected to the front- and back-side extraction electrodes 31a and 32a at the same locations. Also, the second and third electrode pads 15 and 16 have the different potential. Furthermore, no short circuiting or the like will occur with this configuration. The effect is the same when the electrode pad that is electrically connected to the front-side extraction electrode 31a is varied from the third electrode pad 16 to the first electrode pad 14, and the crystal plate 3 is supported at one end on the internal bottom surface of the base 1 (see the receptacle 10). As a result, this affords greater freedom in the holding of the crystal plate 3 in the base 1. Also, in this case, and particularly as shown in FIGS. 9 and 10, the effect will be even more pronounced if the area capacity of the first to fourth electrode pads 14, 15, 16, and 17 is set to fit within the electrode pad formation regions 142, 152, 162, and 172, and the area capacity of the fourth electrode pad 17 is set to be smaller than the area capacity of the first to third electrode pads 14, 15, and 16 (that is, if the area capacity of the first to fourth electrode pads 14, 15, 16, and 17 is asymmetric). In other words, connection reliability and production efficiency can be increased if the electrode pads with the different potential and a larger capacity (such as the first and second electrode pads 14 and 15 or the second and third electrode pads 15 and 16 shown in FIG. 10) are arbitrarily set as the locations that are electrically connected (joined) to the front- and back-side extraction electrodes 31a and 32a of the crystal plate 3.

Figure 13:
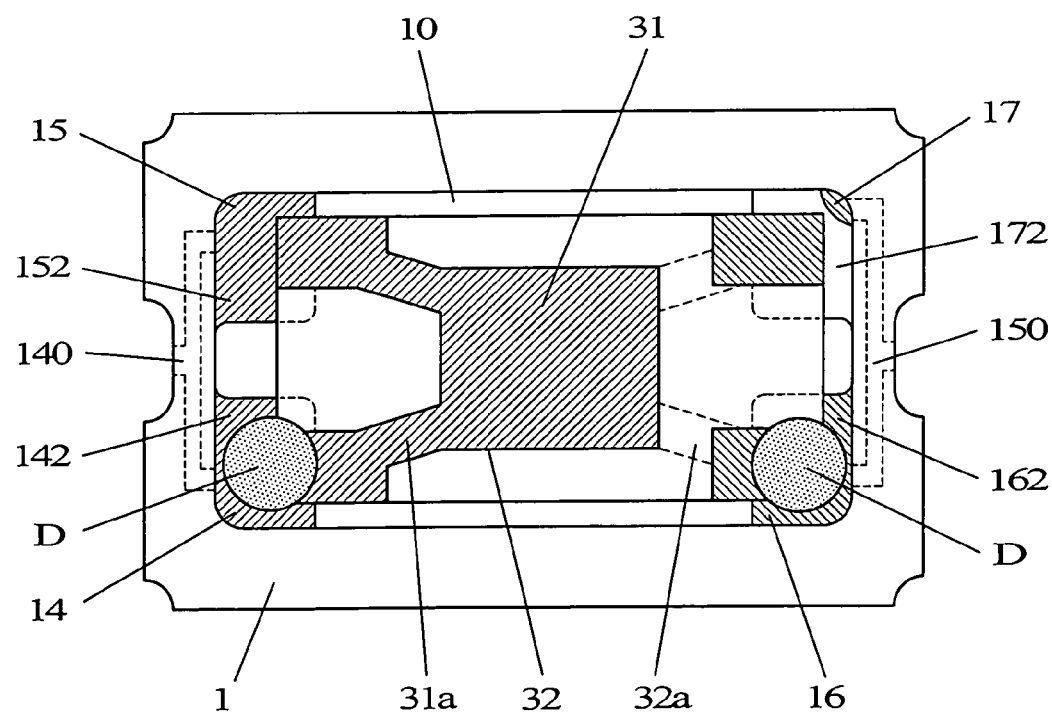
FIG. 13 is a plan view of the base of a surface mount device of crystal resonator according to another embodiment.

Also, in the first to third embodiments above, as shown in FIGS. 4, 6, and 9, the first electrode pad 14 and the second electrode pad 15 are extended to a terminal electrode on the bottom surface of the base, electrically independently, so that current can be applied at the different potential. Also, the first electrode pad 14 and the third electrode pad 16 are connected in common by the first connecting electrode 140 so that current can be applied at the same potential. Also, the second electrode pad 15 and the fourth electrode pad 17 are connected in common by the second connecting electrode 150 so that current can be applied at the same potential. Nevertheless, the present invention is not limited to this, and a crystal resonator such as that shown in FIG. 13 may be used, for example. With the crystal resonator shown in FIG. 13, the first electrode pad 14 and the third electrode pad 16 are extended to a terminal electrode on the bottom surface of the base, electrically independently, so that current can be applied at the different potential. The first electrode pad 14 and the second electrode pad 15 are connected in common by the first connecting electrode 140 and extended to a terminal electrode on the bottom surface of the base so that current can be applied at the same potential. Also, the third electrode pad 16 and the fourth electrode pad 17 are connected in common by the second connecting electrode 150 and extended to a terminal electrode on the bottom surface of the base so that current can be applied at the same potential. Specifically, unlike with the crystal resonator shown in FIGS. 4, 6, and 9, the crystal resonator shown in FIG. 13 is such that the first and second electrode pads 14 and 15, and the third and fourth electrode pads 16 and 17 are connected along the short sides of the base 1, which is rectangular in plan view. Also, the extraction electrode 31a of the crystal plate 3 used in this crystal resonator is extracted from the drive electrode 31 to both corners of one short side (the corners with the first and second electrode pads 14 and 15) of the crystal plate 3, and the extraction electrode 32a of the crystal plate 3 is extracted from the drive electrode 32 to both corners of the other short side (the corners with the third and fourth electrode pads 16 and 17) of the crystal plate 3.

As discussed above, with the crystal resonator according to the first to third embodiments above, the above-mentioned crystal plate package and the crystal plate 3 are provided, the crystal plate 3 is held on the internal bottom surface of the base 1, and the drive electrodes 31 and 32 of the crystal plate 3 are electrically connected to one or more of the first to fourth electrode pads 14, 15, 16, and 17 of the base 1, which is why the characteristic effects discussed above are obtained. Accordingly, the crystal plate 3 can be held and mounted in the base 1 without limiting the direction in which the crystal plate 3 is held on the internal bottom surface of the base 1. Also, even with a plurality of types of crystal plate 3 (see FIGS. 4, 5, and 9 to 13) with different patterns of the drive electrodes 31 and 32 (including the extraction electrodes 31a and 32a), the crystal plate package can be used as a common crystal plate package for a plurality of types of crystal plate 3.

Furthermore, the present invention can be worked in various other forms without deviating from the basic characteristics or the spirit thereof. Accordingly, the embodiments given above are in all respects nothing more than examples, and should not be interpreted as being limiting in nature. The scope of the present invention is indicated by the claims, and is not restricted in any way to the text of this specification. Furthermore, all modifications and variations belonging to equivalent claims of the patent claims are within the scope of the present invention.

Also, this application claims priority right on the basis of Japanese Patent Application 2004-142082 submitted in Japan on May 21, 2004, the entire contents of which are incorporated into this application by reference herein.

INDUSTRIAL APPLICABILITY

The present invention can be applied to a surface mount device of piezoelectric resonator device used in surface mount device of crystal resonators, crystal filters, crystal oscillators, and other such electronic devices.

The invention claimed is:

1. A piezoelectric resonator element package, comprising:
    a base that holds a piezoelectric resonator element on an internal bottom surface of the base, the piezoelectric resonator element having drive electrodes formed on front and back sides of the piezoelectric resonator element and being arranged such that one of the drive electrodes is opposed to the internal bottom surface of the base; and
    a cap for hermetically sealing the piezoelectric resonator element,
    wherein the base includes four electrode pads that electrically connect to the drive electrodes of the piezoelectric resonator element, each of the four electrode pads being formed on a respective corner of the internal bottom surface of the base, the four electrode pads consisting of a first electrode pad, a second electrode pad, a third electrode pad, and a fourth electrode pad,
    wherein the first electrode pad and the second electrode pad are formed along a predetermined side of the internal bottom surface of the base,
    the first electrode pad and the third electrode pad are formed along one of two sides that are perpendicular to the predetermined side,
    the second electrode pad and the fourth electrode pad are formed along the other of the two sides that are perpendicular to the predetermined side,
    the first electrode pad and the second electrode pad have a different potential,
    the first electrode pad and the third electrode pad are connected by a first connecting electrode and have a same potential,
    the second electrode pad and the fourth electrode pad are connected by a second connecting electrode and have a same potential,
    and wherein avoidance means is provided for avoiding electrical connection between at least one of the first and third electrode pads with at least one of the second and fourth electrode pads, the avoidance means comprising bumps that are formed on the four electrode pads and that are smaller than the electrode pads, at least one of the bumps being formed at a location that does not overlap with the drive electrode that is opposed to the internal bottom surface of the base.

2. The piezoelectric resonator element package according to claim 1,
    wherein the base is composed of a ceramic material, and the electrode pads are formed by metallization, and the bumps are formed of a same material as the electrode pads.

3. The piezoelectric resonator element package according to claim 2,
    wherein the electrode pads, the bumps, and the first and second connecting electrodes are formed in point symmetry, with a center point being a center of the internal bottom surface of the base.

4. The piezoelectric resonator element package according to claim 3,
    wherein the first connecting electrode and the second connecting electrode are formed with a substantially same area capacity.

5. A piezoelectric resonator, provided with the piezoelectric resonator element package according to claim 3 and a piezoelectric resonator element having drive electrodes formed on front and back sides of the piezoelectric resonator element,
    wherein the piezoelectric resonator element is held on the internal bottom surface of the base, and the electrode pads of the base and the drive electrodes of the piezoelectric resonator element are electrically connected.

6. The piezoelectric resonator element package according to claim 2,
    wherein the first connecting electrode and the second connecting electrode are formed with a substantially same area capacity.

7. A piezoelectric resonator, provided with the piezoelectric resonator element package according to claim 2 and a piezoelectric resonator element having drive electrodes formed on front and back sides of the piezoelectric resonator element,
    wherein the piezoelectric resonator element is held on the internal bottom surface of the base, and the electrode pads of the base and the drive electrodes of the piezoelectric resonator element are electrically connected.

8. The piezoelectric resonator element package according to claim 1,
    wherein the electrode pads, the bumps, and the first and second connecting electrodes are formed in point symmetry, with a center point being a center of the internal bottom surface of the base.

9. The piezoelectric resonator element package according to claim 8,
    wherein the first connecting electrode and the second connecting electrode are formed with a substantially same area capacity.

10. A piezoelectric resonator, provided with the piezoelectric resonator element package according to claim 8 and a piezoelectric resonator element having drive electrodes formed on front and back sides of the piezoelectric resonator element,
    wherein the piezoelectric resonator element is held on the internal bottom surface of the base, and the electrode pads of the base and the drive electrodes of the piezoelectric resonator element are electrically connected.

11. The piezoelectric resonator element package according to claim 1,
    wherein the first connecting electrode and the second connecting electrode are formed with a substantially same area capacity.

12. A piezoelectric resonator, provided with the piezoelectric resonator element package according to claim 1 and a piezoelectric resonator element having drive electrodes formed on front and back sides of the piezoelectric resonator element, wherein the piezoelectric resonator element is held on the internal bottom surface of the base, and the electrode pads of the base and the drive electrodes of the piezoelectric resonator element are electrically connected.

13. The piezoelectric resonator according to claim 12, further comprising:

a front-side extraction electrode that is extracted from one of the drive electrodes to two end regions at a predetermined end of the piezoelectric resonator element, the front-side extraction electrode being formed on the front side of the piezoelectric resonator element; and a back-side extraction electrode that is extracted from one of the drive electrodes to two end regions at an end of the piezoelectric resonator element opposite from the predetermined end of the piezoelectric resonator element, the back-side extraction electrode being formed on the back side of the piezoelectric resonator element, wherein the front-side extraction electrode is electrically connected to at least one of the electrode pads, and the back-side extraction electrode is electrically connected to at least one of the electrode pads which has a different potential from that of the at least one of the electrode pads electrically connected to the front-side extraction electrode.

14. A piezoelectric resonator element package, comprising:

a base that holds a piezoelectric resonator element on an internal bottom surface of the base, the piezoelectric resonator element having drive electrodes formed on front and back sides of the piezoelectric resonator element; and a cap for hermetically sealing the piezoelectric resonator element, wherein the base includes four electrode pads that electrically connect to the drive electrodes of the piezoelectric resonator element, each of the four electrode pads being formed on a respective corner of the internal bottom surface of the base, the four electrode pads consisting of a first electrode pad, a second electrode pad, a third electrode pad, and a fourth electrode pad, wherein the first electrode pad and the second electrode pad are formed along a predetermined side of the internal bottom surface of the base, the first electrode pad and the third electrode pad are formed along one of two sides that are perpendicular to the predetermined side, the second electrode pad and the fourth electrode pad are formed along the other of the two sides that are perpendicular to the predetermined side, the first electrode pad and the second electrode pad have a different potential, the first electrode pad and the third electrode pad are connected by a first connecting electrode and have a same potential, the second electrode pad and the fourth electrode pad are connected by a second connecting electrode and have a same potential, and wherein avoidance means is provided for avoiding electrical connection between at least one of the first and third electrode pads with at least one of the second and fourth electrode pads, the avoidance means being configured such that four electrode pad formation regions are formed in corners of the internal bottom surface of the base for the formation of the four electrode pads, respectively, wherein an area capacity of each of the electrode pads fits within a corresponding one of the four electrode pad formation regions, and the area capacity of at least one of the electrode pads is set to be less than the area capacity of the other electrode pads.

15. The piezoelectric resonator element package according to claim 14, wherein the at least one of the electrode pads with the lesser area capacity is formed away from the other electrode pad formation regions within the corresponding electrode pad formation region in which the at least one of the electrode pads with the lesser area capacity is formed.

16. The piezoelectric resonator element package according to claim 15, wherein the first connecting electrode and the second connecting electrode are formed with a substantially same area capacity.

17. The piezoelectric resonator element package according to claim 14, wherein the first connecting electrode and the second connecting electrode are formed with a substantially same area capacity.

18. A piezoelectric resonator, provided with the piezoelectric resonator element package according to claim 14 and a piezoelectric resonator element having drive electrodes formed on front and back sides of the piezoelectric resonator element, wherein the piezoelectric resonator element is held on the internal bottom surface of the base, and the electrode pads of the base and the drive electrodes of the piezoelectric resonator element are electrically connected.

* * * * *